(12) United States Patent
Chen et al.

(10) Patent No.: US 10,729,241 B2
(45) Date of Patent: Aug. 4, 2020

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 153 days.

(21) Appl. No.: 15/993,732

(22) Filed: May 31, 2018

(65) Prior Publication Data

US 2019/0200759 A1    Jul. 4, 2019

(30) Foreign Application Priority Data

Dec. 28, 2017   (TW) .............................. 106146673 A (51) Int. Cl.
*A47B 88/493* (2017.01)
*H05K 7/14* (2006.01)
*A47B 88/443* (2017.01)

(52) U.S. Cl.
CPC ......... *A47B 88/493* (2017.01); *H05K 7/1489* (2013.01); *A47B 88/443* (2017.01); *A47B 2210/0032* (2013.01); *A47B 2210/0037* (2013.01); *A47B 2210/0059* (2013.01); *A47B 2210/0081* (2013.01)

(58) Field of Classification Search
CPC ............... A47B 88/443; A47B 88/493; A47B 2210/0032; A47B 2210/0037; A47B 2210/0051; A47B 2210/0081; H05K 7/1489

See application file for complete search history.

(56) References Cited

U.S. PATENT DOCUMENTS

| | | | | |
|---|---|---|---|---|
| 3,488,097 A | * | 1/1970 | Fall | A47B 88/493 384/18 |
| 3,701,577 A | * | 10/1972 | Fischer | A47B 88/493 312/334.12 |
| 4,121,876 A | * | 10/1978 | Ratti | A47B 88/493 312/334.13 |
| 4,285,560 A | | 8/1981 | Miller | |
| 4,423,914 A | * | 1/1984 | Vander Ley | A47B 88/493 312/333 |
| 4,662,761 A | * | 5/1987 | Hoffman | A47B 88/493 384/18 |

(Continued)

FOREIGN PATENT DOCUMENTS

EP  3025615 A1  6/2016
JP  H0355745 U  5/1991

*Primary Examiner* — Daniel J Troy
*Assistant Examiner* — Ryan A Doyle
(74) *Attorney, Agent, or Firm* — Alan D. Kamrath; Karin L. Williams; Mayer & Williams PC (57) ABSTRACT

A slide rail assembly includes a first rail, a second rail and a mounting member. The mounting member is arranged with a third rail and a fourth rail. Wherein, the third rail is movable relative to the first rail, and the second rail is movable relative to the fourth rail.

10 Claims, 11 Drawing Sheets

(56) References Cited

U.S. PATENT DOCUMENTS

| | | | | |
|---|---|---|---|---|
| 4,696,582 A | * | 9/1987 | Kasten | A47B 88/493 |
| | | | | 384/18 |
| 4,993,847 A | * | 2/1991 | Hobbs | A47B 88/57 |
| | | | | 312/334.46 |
| 4,998,828 A | | 3/1991 | Hobbs | |
| 5,181,781 A | * | 1/1993 | Wojcik | A47B 88/40 |
| | | | | 384/21 |
| 5,181,782 A | * | 1/1993 | Wojcik | A47B 88/493 |
| | | | | 384/21 |
| 6,244,679 B1 | | 6/2001 | Robertson et al. | |
| 7,357,468 B2 | * | 4/2008 | Hwang | A47B 88/49 |
| | | | | 312/333 |
| 8,147,011 B2 | * | 4/2012 | Chen | H05K 7/1489 |
| | | | | 312/333 |
| 8,632,143 B2 | | 1/2014 | Jeakings | |
| 9,155,386 B2 | | 10/2015 | Hashemi et al. | |
| 10,499,738 B2 | * | 12/2019 | Chen | A47B 88/443 |
| 2015/0366345 A1 | | 12/2015 | Chen et al. | |
| 2016/0150880 A1 | | 6/2016 | Chen et al. | |
| 2019/0200757 A1 | * | 7/2019 | Chen | A47B 88/443 |

\* cited by examiner

SLIDE RAIL ASSEMBLY

BACKGROUND OF THE INVENTION

1. Field of the Invention

The present invention relates to a slide rail, and more particularly, to a slide rail assembly having two or more than two slide rails.

2. Description of the Prior Art

Generally in a rack system, a carried object, such as a drawer, a chassis of an electronic device or the like, is arranged with slide rail assemblies at two sides in order to be mounted onto a rack. Wherein, the rack usually has a plurality of posts for mounting the slide rail assemblies. Furthermore, each of the posts has a specific height, such that the posts can be configured to mount a plurality of sets of slide rail assemblies.

However, due to space restrictions, a width of each slide rail assembly can not exceed a particular specification; otherwise, the rack may not have enough space to accommodate the carried object. In other words, the width of the slide rail assembly having two or more than two slide rails is limited. Therefore, it is important to develop a different slide rail product.

SUMMARY OF THE INVENTION

The present invention relates to a slide rail assembly having two or more than two slide rails mounted to each other through a mounting member.

According to an embodiment of the present invention, a slide rail assembly comprises a first, rail, a second rail, a mounting member, a third rail fixedly connected to a first side of the mounting member, and a fourth rail fixedly connected to a second side of the mounting member. Wherein, the third rail is movable relative to the first rail, and the second rail is movable relative to the fourth rail.

Preferably, the first rail and the second rail are up-down arranged and parallel to each other.

Preferably, the mounting member comprises a first part and a second part. The third rail is connected to the first part. The fourth rail is connected to the second part.

Preferably, the mounting member further comprises a horizontal part. The first part and the second part are substantially perpendicularly connected to the horizontal part and respectively extended along different directions.

Preferably, the first side of the mounting member is opposite to the second side of the mounting member.

Preferably, the first rail comprises a first wall, a second wall and a side wall connected between the first wall and the second wall of the first rail. A first passage is defined by the first wall, the second wall and the side wall. The third rail is movable relative to the first rail through the first passage.

Preferably, the third rail comprises a first wall, a second wall and a side wall connected between the first wall and the second wall of the third rail, the side wall of the third rail is connected to the first part of the mounting member, and the first wall and the second wall of the third rail are located within the first passage.

Preferably, the slide rail assembly further comprises a first slide assisting device movably mounted between the first rail and the third rail. The first slide assisting device comprises a plurality of slide assisting members configured to be supported between the first wall of the first rail and the first wall of the third rail, and configured to be supported between the second wall of the first rail and the second wall of the third rail.

Preferably, the first wall of the first rail has a first section and a second section bent relative to the first section. The second wall of the first rail has a third section and a fourth section bent relative to the third section.

Preferably, the fourth rail comprises a first wall, a second wall and a side wall connected between the first wall and the second wall of the fourth rail. The side wall of the fourth rail is connected to the second part of the mounting member. A second passage is defined by the first wall, the second wall and the side wall of the fourth rail. The second rail is movable relative to the fourth rail through the second passage.

Preferably, the second rail comprises a first wall, a second wall and a side wall connected between the first wall and the second wall of the second rail. The first wall and the second wall of the second rail are located within the second passage.

Preferably, the slide rail assembly further comprises a second slide assisting device movably mounted between the fourth rail and the second rail. The second slide assisting device comprises a plurality of slide assisting members configured to be supported between the first wall of the second rail and the first wall of the fourth rail, and configured to be supported between the second wall of the second rail and the second wall of the fourth rail.

Preferably, the slide rail assembly further comprises an engaging member and an elastic member. The engaging member is movably mounted to the mounting member. The elastic member is configured to provide an elastic force to the engaging member. When the second rail is moved from a retracted position to a first predetermined position along a first direct, the engaging member is engaged with the second rail in response to the elastic force of the elastic member, so as to allow the mounting member to be synchronously moved with the second rail along the first direction.

Preferably, the engaging member is pivoted to the mounting member. One of the first wall and the second wall of the fourth rail has a notch. The notch is configured to allow an engaging part of the engaging member to insert therein. One of the first wall and the second wall of the second rail has an abutting part. When the second rail is located at the first predetermined position, the engaging part of the engaging member contacts the abutting part, in order to allow the second rail to drive the mounting member to move along the first direction through the abutting part.

Preferably, the slide rail assembly further comprises a working member arranged on the first rail. When the second rail is moved from the first predetermined position to a second predetermined position along the first direction, the engaging member is moved by the working member to disengage the engaging part of the engaging member from the abutting part, such that the mounting member is no longer synchronously moved with the second rail.

Preferably, one of the first wall and the second wall of the first rail has a positioning part. When the mounting member is moved to a third predetermine disposition along the first direction, the engaging member is engaged with the positioning part of the first rail in response to the elastic force of the elastic member, in order to prevent the mounting member from being moved relative to the first rail along the first direction or a second direction.

Preferably, the slide rail assembly further comprises a buffer member arranged on the first rail, and a contact member arranged on the third rail. When the mounting member is moved a predetermined distance along the first direction, the contact member contacts the buffer member for providing a buffer effect.

Preferably, a first blocking base is arranged adjacent to a front part of the first rail. The slide rail assembly further comprises a holding base. The buffer member is mounted between the first blocking base and the holding base.

Preferably, a second blocking base is arranged adjacent to a front part of the fourth rail, and a blocking member is movably connected to the second rail. When the second rail is moved relative to the fourth rail along the first direction to an open position, the blocking member is configured to contact a blocking part of the second blocking base at a blocking position, in order to prevent the second rail from being further moved along the first direction, and an operating member is configured to be operated to move the blocking member to be no longer at the blocking position.

Preferably, when the second rail is moved from the open position to a predetermined retracted position along the second direction, the second rail is configured to drive the engaging member to move, to disengage the engaging member from the positioning part of the first rail.

These and other objectives of the present invention will no doubt, become obvious to those of ordinary skill in the art after reading the following detailed description of the preferred embodiment that is illustrated in the various figures and drawings.

DETAILED DESCRIPTION

Figure 1:
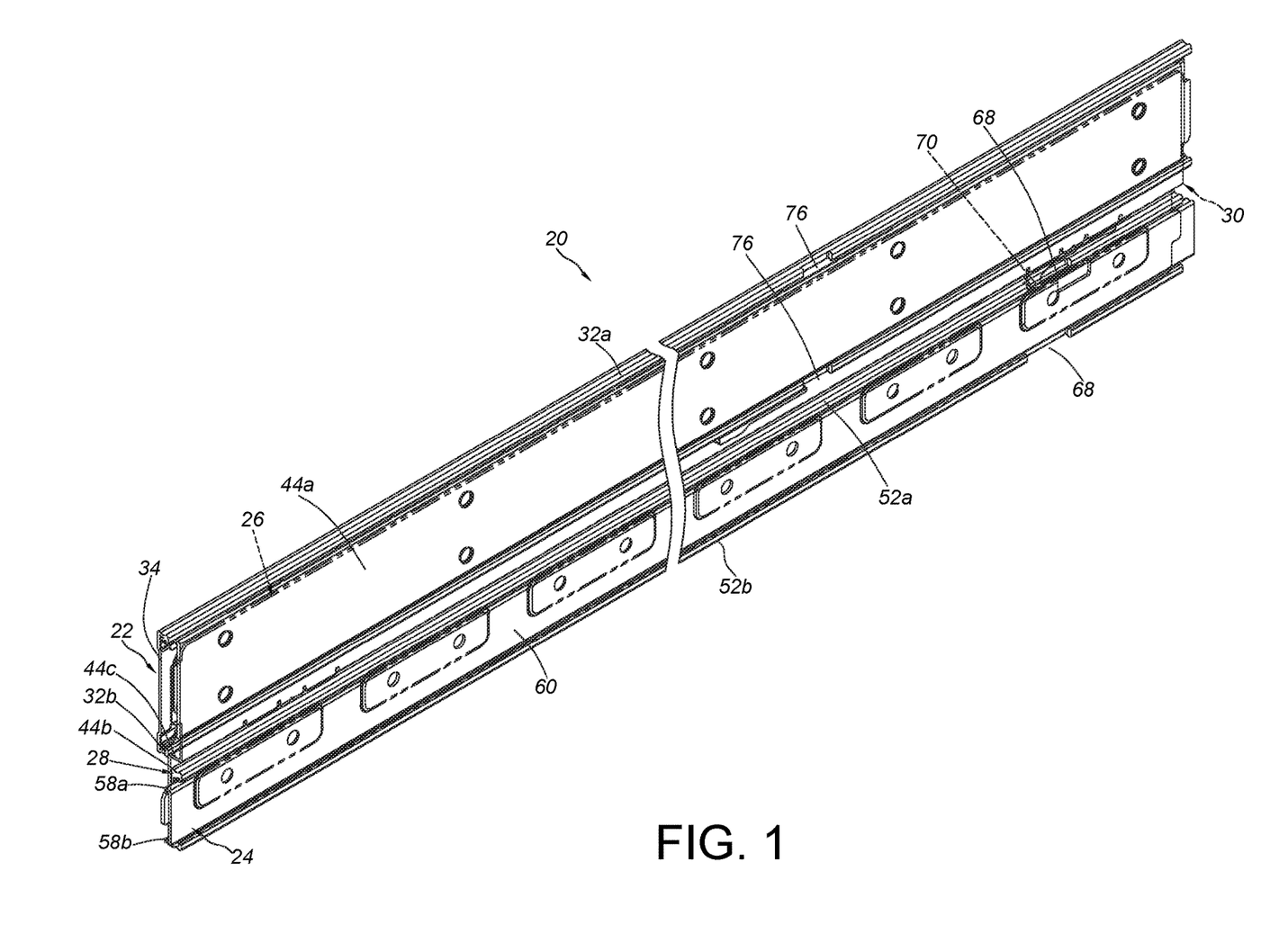
FIG. 1 is a diagram showing a slide rail assembly according to an embodiment of the present invention.

As shown in FIG. 1, a slide rail assembly 20 of the present invention comprises a first rail 22, a second rail 24, a third rail 26, a fourth rail 28 and a mounting member 30.

Figures 2, 3:
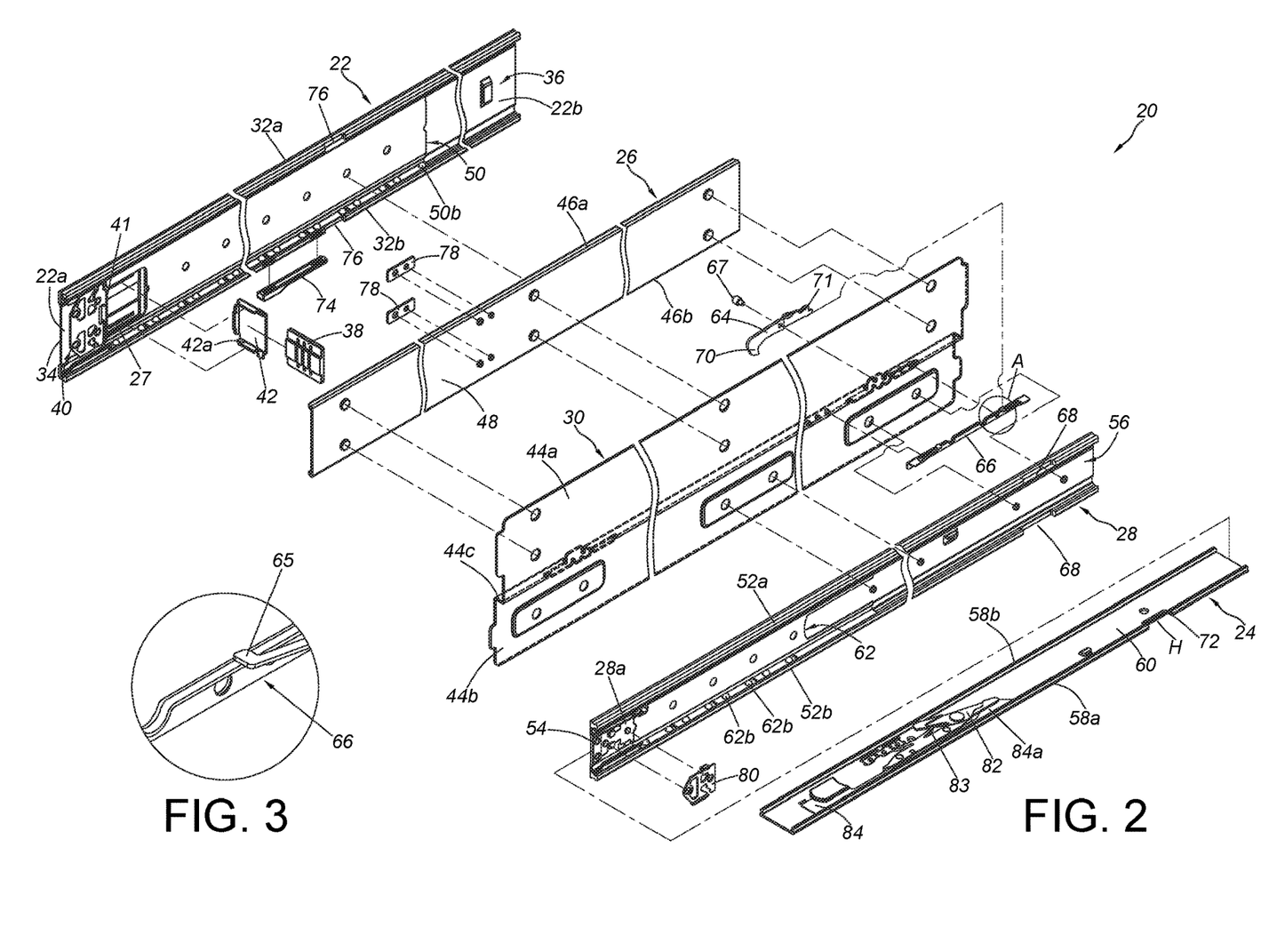
FIG. 2 is an exploded view of the slide rail assembly according to an embodiment of the present invention.
FIG. 3 is an enlarged view of an area A of FIG. 2.
Figure 4:
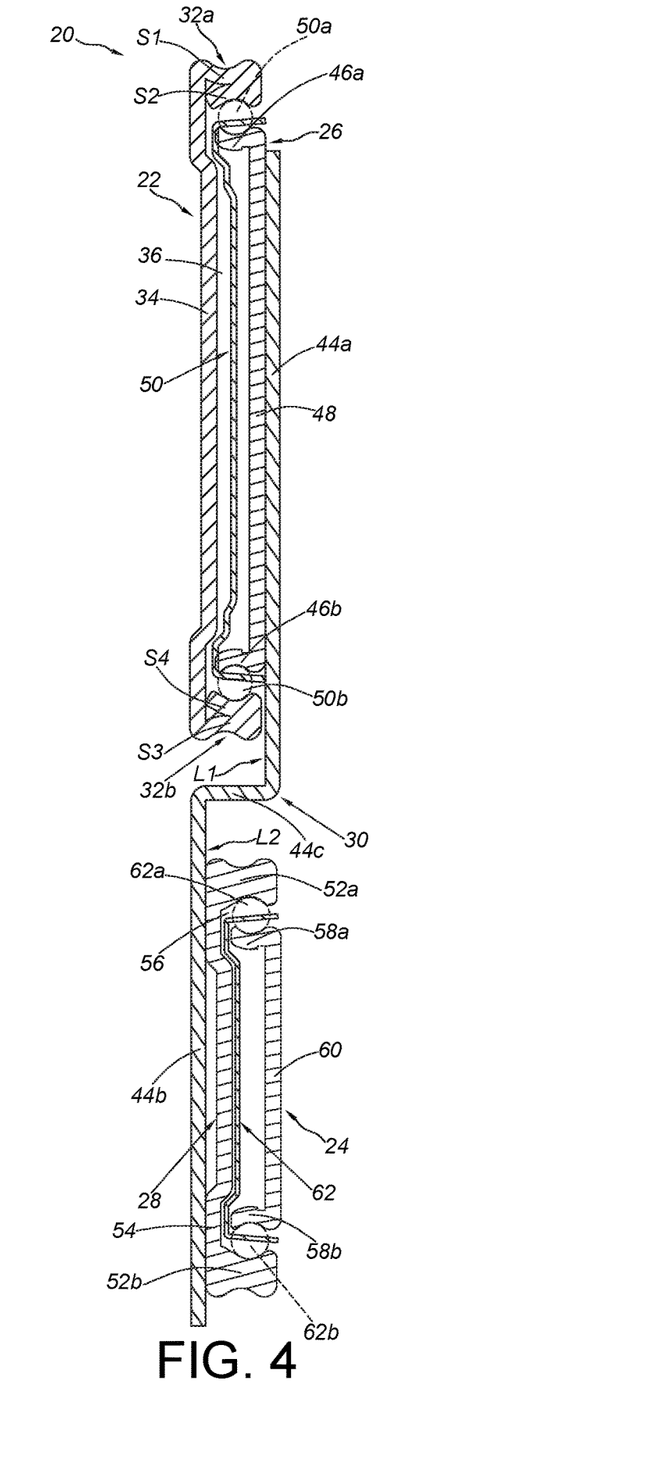
FIG. 4 is a cross-sectional view of the slide rail assembly according to an embodiment of the present invention.

As shown in FIG. 2 to FIG. 4, the first rail 22 and the second rail 24 are up-down arranged and parallel to each other, such that the first rail 22 and the second rail 24 are arranged at different heights. In the present embodiment (please refer to FIG. 4), the first rail 22 is arranged above the second rail 24. However, in an alternative embodiment, the second rail 24 can be arranged above the first rail 22. The present invention is not limited thereto. The third rail 26 and the fourth rail 28 are respectively fixedly connected to a first part 44a and a second part 44b of the mounting member 30. Wherein, the third rail 26 is movable relative to the first rail 22, and the second rail 24 is movable relative to the fourth rail 28.

The first rail 22 comprises a first wall 32a, a second wall 32b and a side wall 34 connected between the first wall 32a and the second wall 32b of the first rail 22. A first passage 36 is defined by the first wall 32a, the second wall 32b and the side wall 34. The first rail 22 has a front part 22a and a rear part 22b.

The mounting member 30 is arranged in an N-like shape. The first part 44a and the second part 44b of the mounting member 30 are arranged as an upper part and a lower part respectively. Preferably, the mounting member 30 further comprises a horizontal part 44c. The first part 44a and the second part 44b are substantially perpendicularly connected to two portions of the horizontal part 44c and respectively extended along different directions. For example, the first part 44a is extended upward, and the second part 44b is extended downward.

The third rail 26 is connected to the first part 44a of the mounting member 30 and located at a first side L1 of the mounting member 30. The third rail 26 is movable relative to the first rail 22 through the first passage 36. Wherein, the third rail 26 comprises a first wall 46a, a second wall 46b and a side wall 48 connected between the first wall 46a and the second wall 46b of the third rail 26. The side wall 48 of the third rail 26 is connected to the first part 44a of the mounting member 30. The first wall 46a and the second wall 46b of the third rail 26 are located within the first passage 36. Preferably, the slide rail assembly 20 further comprises a first slide assisting device 50 movably mounted between the first rail 22 and the third rail 26. The first slide assisting device 50 comprises a plurality of slide assisting members, such as a first slide assisting member 50a and a second slide assisting member 50b. The first slide assisting member 50a and the second slide assisting member 50b can be balls, rollers or the like. The first slide assisting member 50a is configured to be supported between the first wall 32a of the first rail 22 and the first wall 46a of the third rail 26. The second slide assisting member 50b is configured to be supported between the second wall 32b of the first rail 22 and the second wall 46b of the third rail 26. Preferably, the first wall 32a of the first rail 22 has a first section S1 and a second section S2 bent relative to the first section S1, and the second wall 32b of the first rail 22 has a third section S3 and a fourth section S4 bent relative to the third section S3. According to such arrangement, structural strength or supporting strength of the first rail 22 can be improved.

The fourth rail 28 is connected to the second part 44b of the mounting member 30 and located at a second side 12 of the mounting member 30. The second side 12 is opposite to the first side L1. The fourth rail 28 comprises a first wall 52a, a second wall 52b and a side wall 54 connected between the first wall 52a and the second wall 52b of the fourth rail 28. The side wall 54 of the fourth rail 28 is connected to the second part 44b of the mounting member 30. A second passage 56 is defined by the first wall 52a, the second wall 52b and the side wall 54 of the fourth rail 28. The second rail 24 is movable relative to the fourth rail 28 through the second passage 56.

The second rail 24 comprises a first wall 58a, a second wall 58b and a side wall 60 connected between the first wall 58a and the second wall 58b of the second rail 24. The first wall 58a and the second wall 58b of the second rail 24 are located within the second passage 56. Preferably, the slide rail assembly 20 further comprises a second slide assisting device 62 movably mounted between the fourth rail 28 and the second rail 24. The second slide assisting device 62 comprises a plurality of slide assisting members, such as a first slide assisting member 62a and a second slide assisting member 62b. The first slide assisting member 62a and the second slide assisting member 62b can be balls, rollers or the like. The first slide assisting member 62a is configured to be supported between the first wall 58a of the second rail 24 and the first wall 52a of the fourth rail 28, and the second slide assisting member 62b is configured to be supported between the second wall 58b of the second rail 24 and the second wall 52b of the fourth rail 28.

Figures 5, 6, 7:
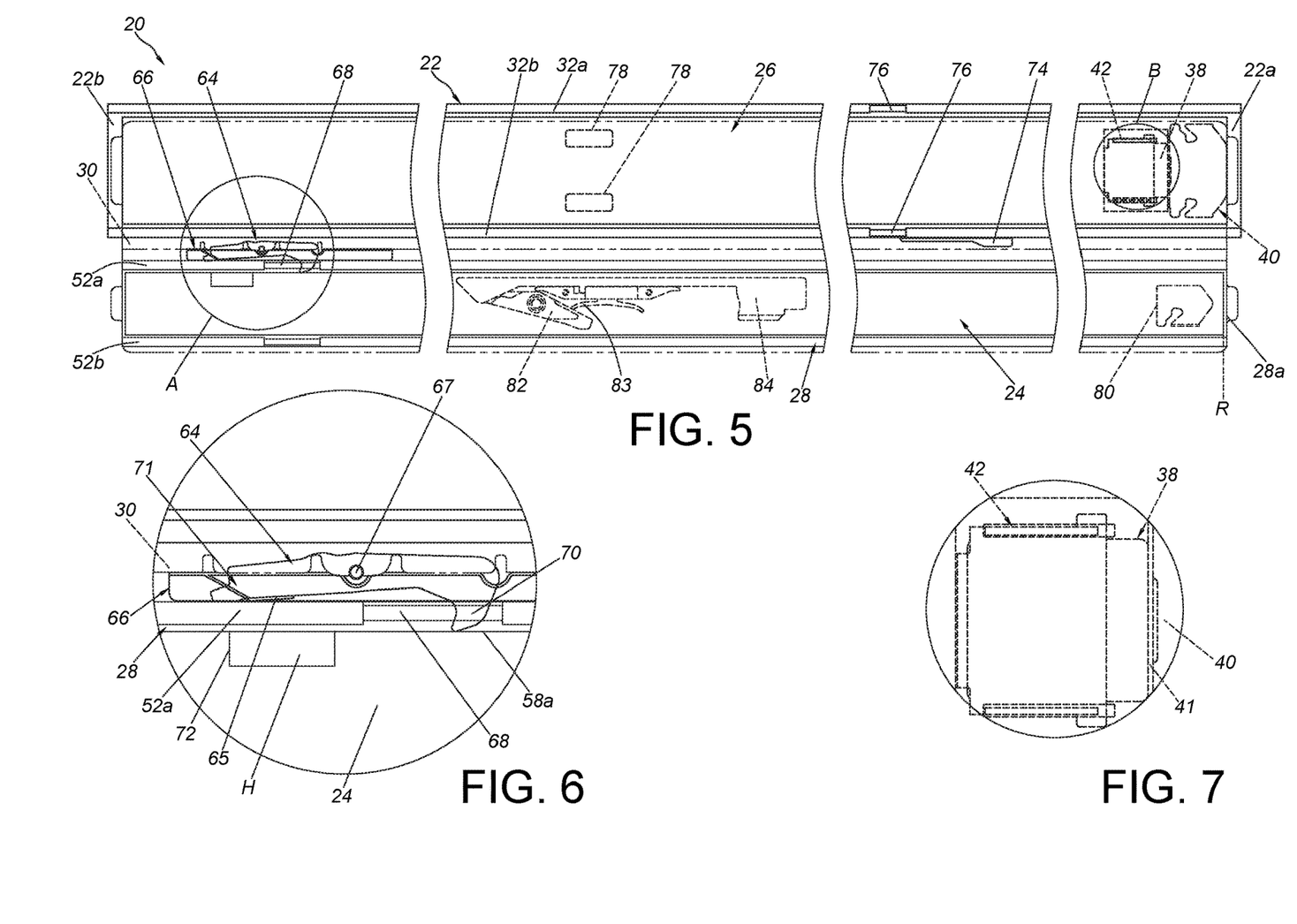
FIG. 5 is a diagram showing the slide rail assembly in a retracted state according to an embodiment of the present invention.
FIG. 6 is an enlarged view of an area A of FIG. 5.
FIG. 7 is an enlarged view of an area B of FIG. 5.

Preferably, as shown in FIG. 2, FIG. 5 and FIG. 6, the slide rail assembly 20 further comprises an engaging member 64 and an elastic member 66. The engaging member 64 is movably mounted to the mounting member 30. In the present embodiment, the engaging member 64 is pivoted relative to the mounting member 30 through a shaft member 67. The elastic member 66 has an elastic part 65 (please also refer to FIG. 3) for providing an elastic force to the engaging member 64. Furthermore, one of the first wall 52a and the second wall 52b of the fourth rail 28 has a hole or a notch 68. The notch 68 is configured to allow a first engaging part 70 of the engaging member 64 to insert, therein. Preferably, the engaging member 64 further has a second engaging part 71. Wherein, the shaft member 67 is located between the first engaging part 70 and the second engaging part 71. Preferably, the elastic part 65 of the elastic member 66 abuts against a portion of the engaging member 64 adjacent to the second engaging part 71. Preferably, one of the first wall 58a and the second wall 38b of the second rail 24 has an abutting part 72. In the present embodiment, the second rail 24 has a space H (such as a hole, a groove, or a notch) for accommodating the first engaging part 70 of the engaging member 64, and the abutting part 72 is a wall around the space H.

Preferably, as shown in FIG. 2 and FIG. 5, the slide rail assembly 20 further comprises a working member 74 arranged on the first rail 22. In the present embodiment, the working member 74 is connected to the second wall 32b of the first rail 22. The working member 74 is configured to work with the engaging member 64.

Preferably, as shown in FIG. 2 and FIG. 5, one of the first wall 32a and the second wall 32b of the first rail 22 has a positioning part 76. The positioning part 76 can be a groove, a hole or a notch.

Preferably, as shown in FIG. 2 and FIG. 5, the slide rail assembly 20 further comprises a buffer member 33 arranged on the first rail 22. In the present embodiment, the buffer member 38 is arranged adjacent to the front part 22a of the first rail 22 (please also refer to FIG. 7), and the buffer member 38 can be a soft pad or made of a soft plastic material, but the present invention is not limited thereto. Preferably, a first blocking base 40 and a holding base 42 are arranged adjacent to the front part 22a of the first rail 22. The buffer member 38 is mounted between the first blocking base 40 and the holding base 42. Wherein, the buffer member 38 is located at a position corresponding to a blocking wall 41 of the first blocking base 40. The blocking wall 41 is configured to abut against the buffer member 38.

Preferably, as shown in FIG. 2 and FIG. 5, the slide rail assembly 20 further comprises at least one contact member 78 arranged on the third rail 26. The contact member 78 is configured to work with the buffer member 38. The contact member 78 can be an independent component connected to the third rail 26; or, the contact member 78 can be integrally formed on the third rail 26. In the present embodiment, the contact member 78 is a protrusion protruded from the side wall 48 of the third rail 26, but the present invention is not limited thereto.

Preferably, as shown in FIG. 2 and FIG. 5, a second blocking base 80 is arranged adjacent to a front part 28a of the fourth rail 28, and a blocking member 82 is movably connected (such as pivoted) to the side wall 60 of the second rail 24. Preferably, an elastic base 83 is configured to provide an elastic force to the blocking member 82, and an operating member 84 is configured to be operated to deflect the blocking member 82.

As shown in. FIG. 5 and FIG. 6, the second rail 24 is located at a retracted position R. Wherein, the first engaging part 70 of the engaging member 64 abuts against the first wall 58a of the second rail 24 through the notch 68 of the fourth rail 28, so as to allow the elastic member 66 (or the elastic part 65 of the elastic member 66) to accumulate an elastic force.

Figures 8, 9:
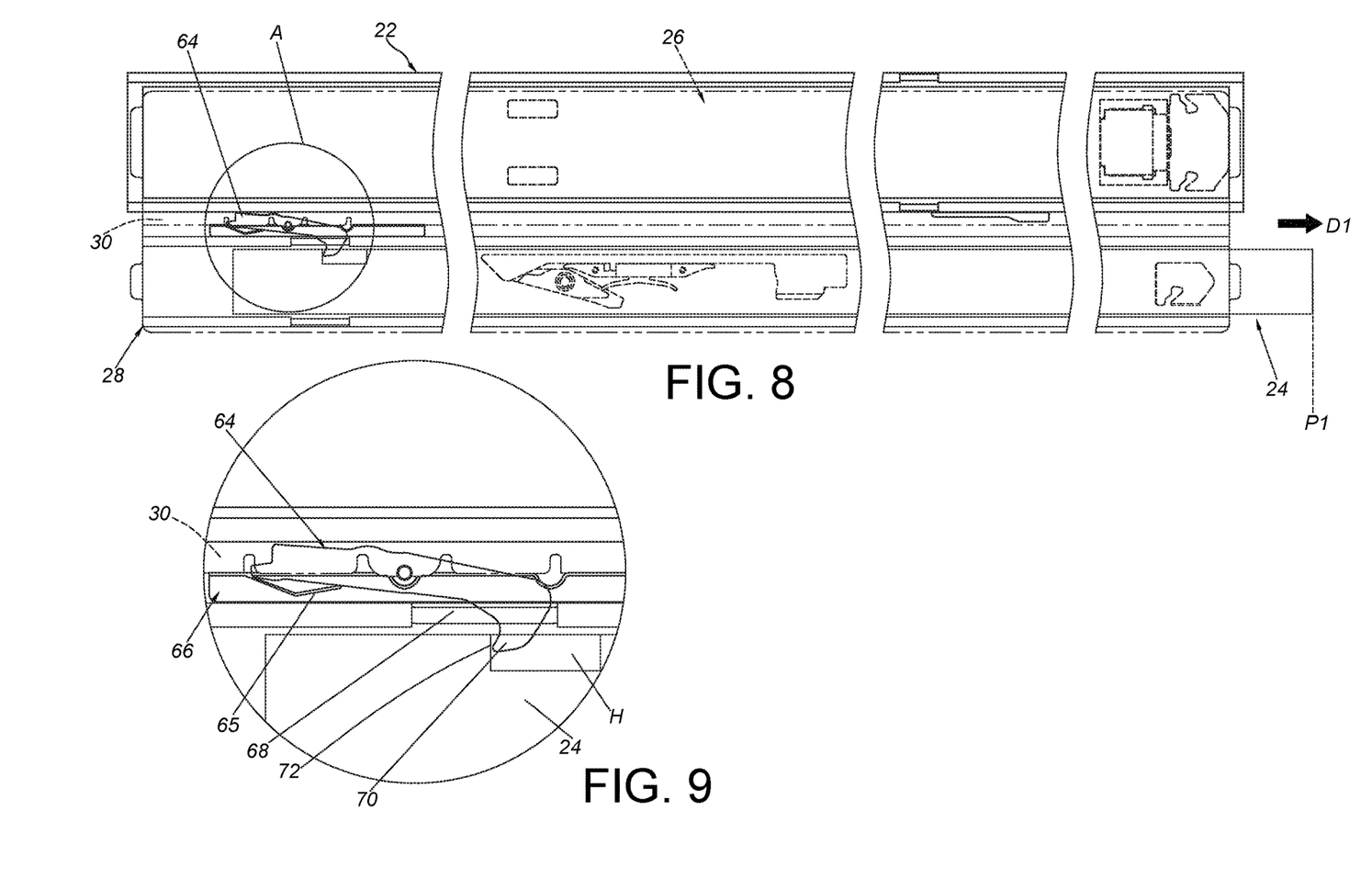
FIG. 8 is a diagram showing a second rail of the slide rail assembly being synchronously moved with a mounting member through an engaging member when the second rail is moved to a first predetermined position along a first direction according to an embodiment of the present invention.
FIG. 9 is an enlarged view of an area A of FIG. 8.

As shown in FIG. 8 and FIG. 9, when the second rail 24 is moved from the retracted position R to a first predetermined position P1 along a first direction D1, the first engaging part 70 of the engaging member 64 enters the space H of the second rail 24 and contacts the abutting part 72 of the second rail 24 in response to the elastic force released from the elastic member 66 (or the elastic part 65 of the elastic member 66), such that the mounting member 30, the third rail 26 and the fourth rail 28 can be synchronously moved with the second rail 24 along the first direction D1.

Figure 10:
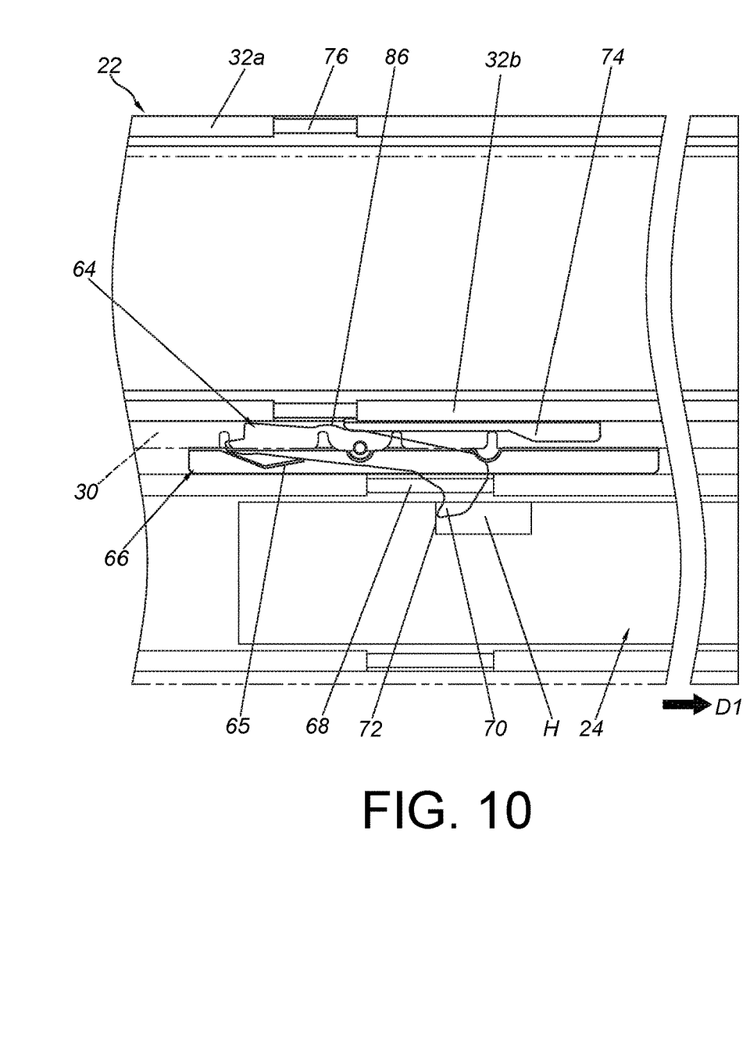
FIG. 10 is a diagram showing a working member on a first rail contacting the engaging member during a process of the second rail and the mounting member of the slide rail assembly being moved to a second predetermined position along the first direction according to an embodiment of the present invention.
Figure 11:
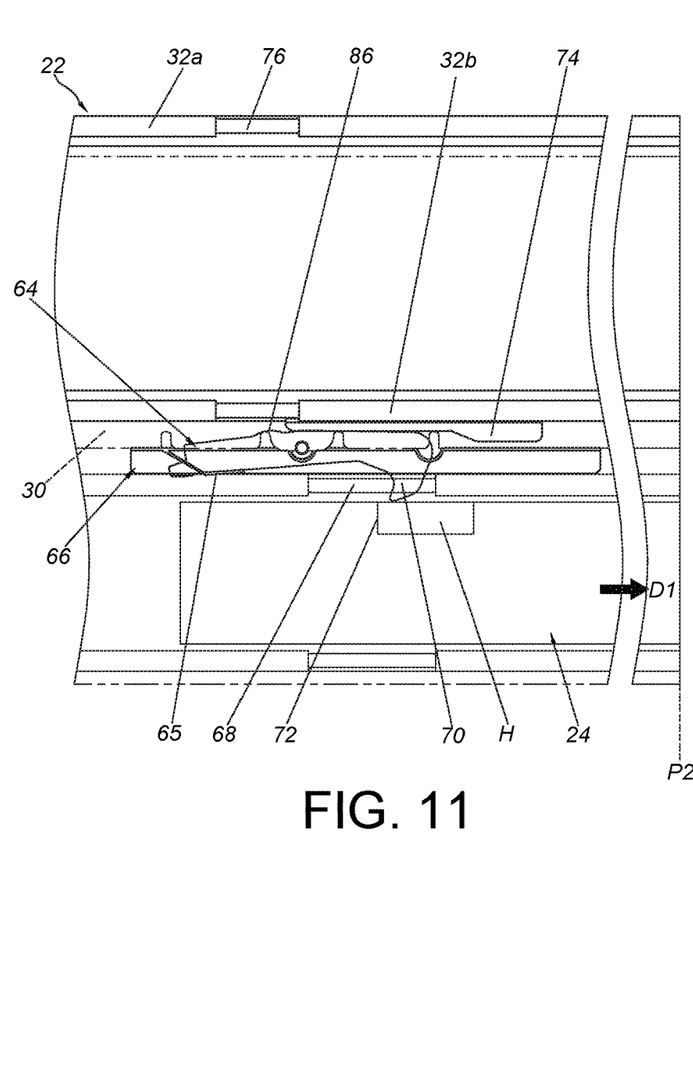
FIG. 11 is a diagram showing the mounting member being unsynchronized with the second rail by the working member when the second rail and the mounting member of the slide rail assembly are moved to the second predetermined position along the first direction according to an embodiment of the present invention.

As shown in FIG. 10 and FIG. 11, during a process of the second rail 24 being moved from the first predetermined position P1 to a second predetermined position P2 along the first direction D1, the engaging member 64 contacts the working member 74. Preferably, one of the engaging member 64 and the working member 74 comprises a guiding part 86, such as an inclined surface or an arc surface, in order to guide the engaging member 64 to move. When the second rail 24 is moved to the second predetermined position P2, the engaging member 64 is deflected by the working member 74, so as to allow the elastic member 66 (or the elastic part 65 of the elastic member 66) to accumulate an elastic force. Wherein, the first engaging part 70 of the engaging member 64 is disengaged from the abutting part 72 of the second rail 24, such that the mounting member 30 is no longer synchronously moved with the second rail 24. In other words, the second rail 24 can be independently moved relative to the first rail 22 along the first direction D1.

Figure 12:
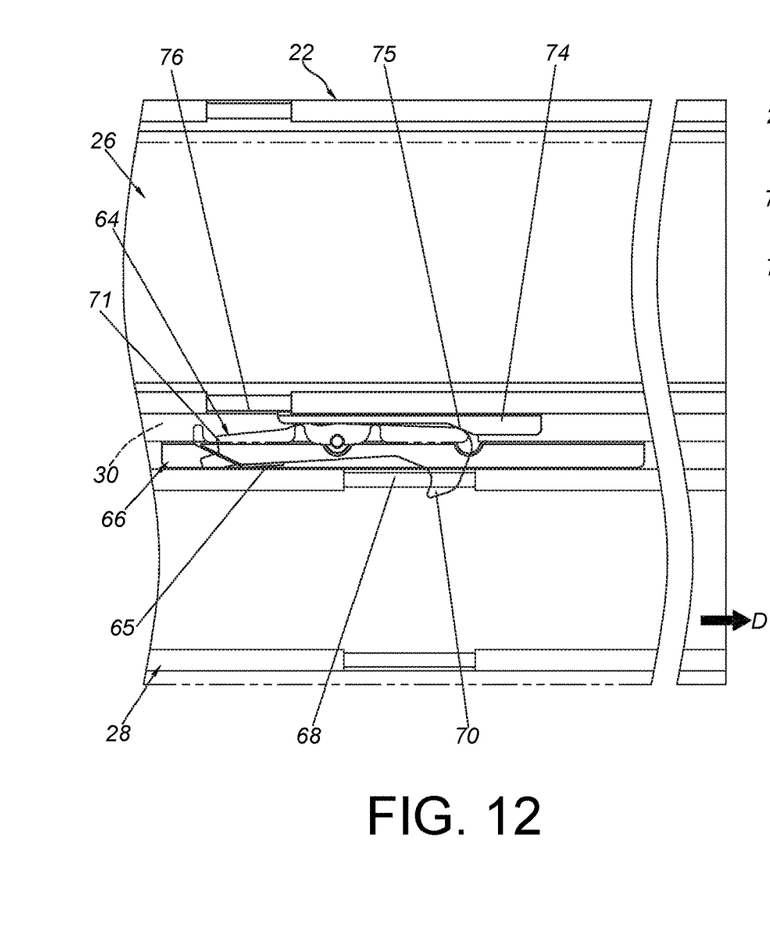
FIG. 12 is a diagram showing the working member contacting the engaging member during a process of the mounting member of the slide rail assembly being moved to a third predetermined position along the first direction according to an embodiment of the present invention.
Figure 13:
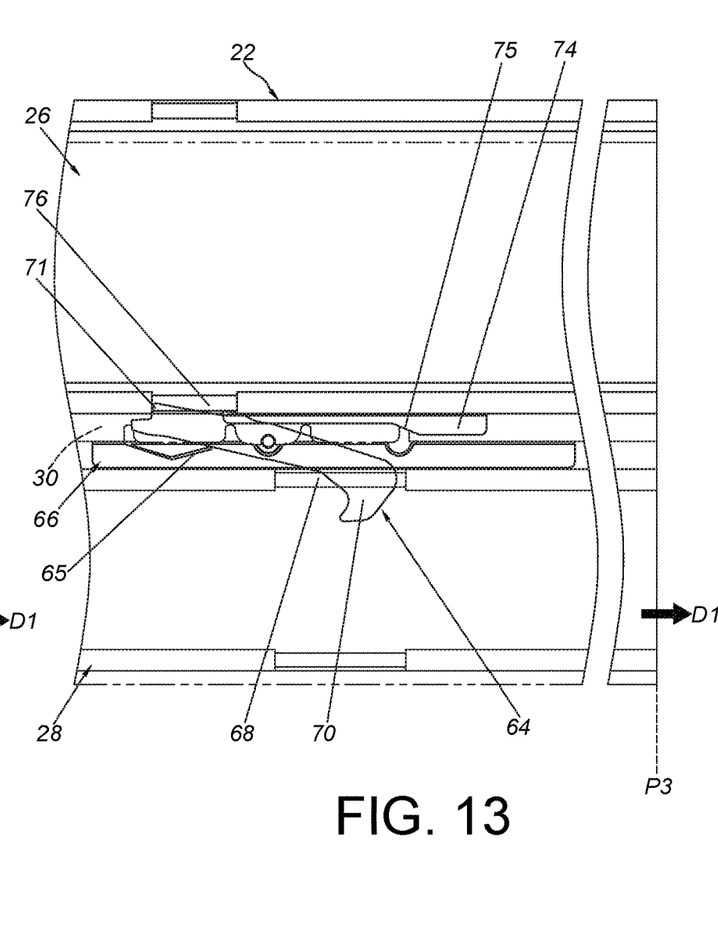
FIG. 13 is a diagram showing the engaging member being engaged with a positioning part of the first rail when the mounting member of the slide rail assembly is moved to the third predetermined position along the first direction according to an embodiment of the present invention.
Figures 14, 15:
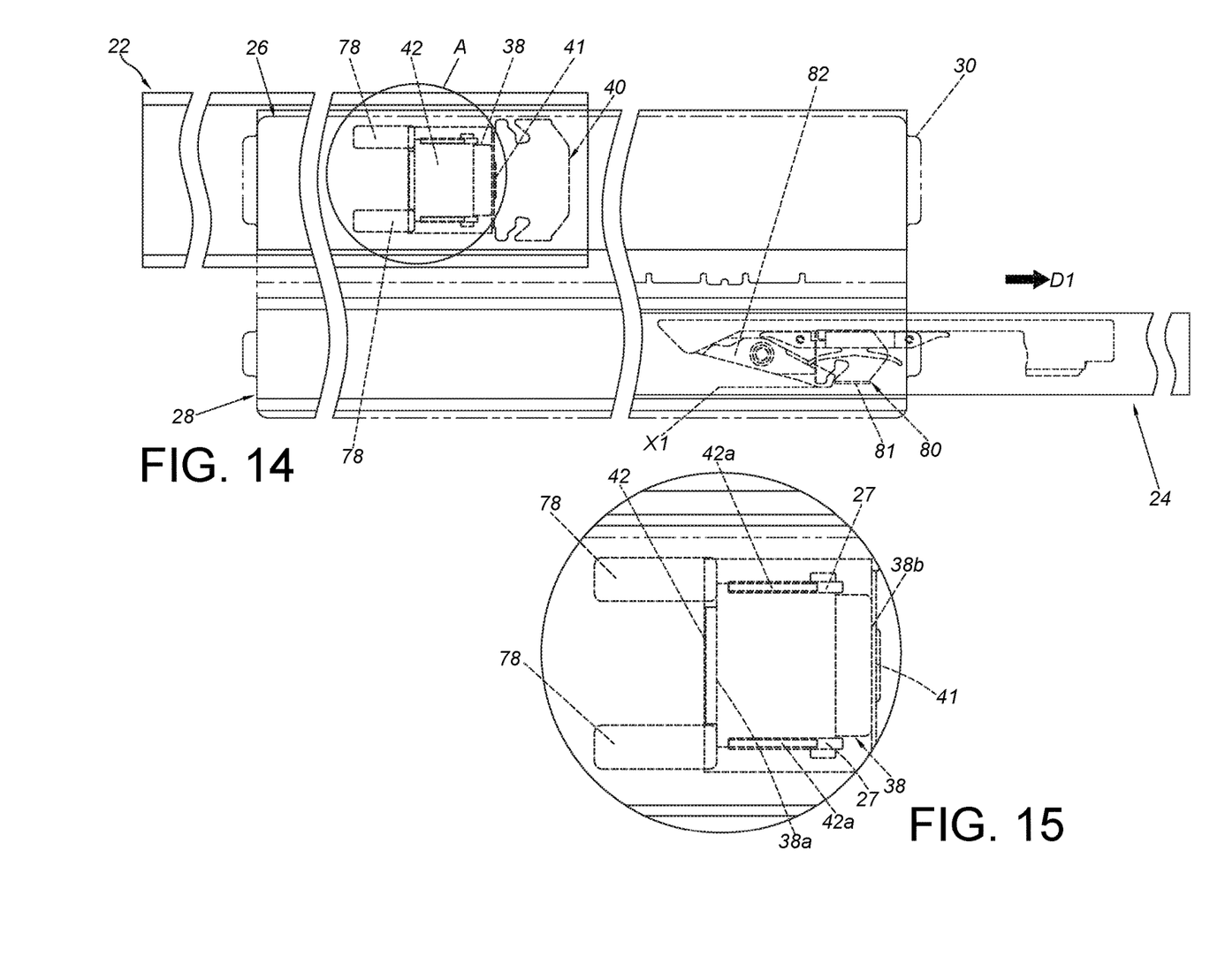
FIG. 14 is a diagram showing the mounting member contacting a buffer member through a contact member when the second rail is moved to a position along the first direction according to an embodiment of the present invention.
FIG. 15 is an enlarged view of an area A of FIG. 14.

As shown in FIG. 12 and FIG. 13, when the mounting member 30, the third rail 26 and the fourth rail 28 are moved relative to the first rail 22 along the first direction D1 to a predetermined position, such as a third predetermined position P3, the engaging member 64 is deflected by the elastic force released from the elastic member 66 (or the elastic part 65 of the elastic member 66) to be engaged with the positioning part 76 of the first rail 22 through the second engaging part 71. Meanwhile, the first engaging part 70 of the engaging member 64 is located in the notch 68 of the fourth rail 28, in order to prevent the mounting member 30 from being moved relative to the first rail 22 along the first direction D1 or a second direction opposite to the first direction D1. Preferably, the working member 74 has a guiding section 75, such as an inclined surface or an arc surface. Through contacting the guiding section 75, the engaging member 64 can be guided to move the second engaging part 71 to be engaged with the positioning part 76 of the first rail 22. Meanwhile, the mounting member 30, the third rail 26 and the fourth rail 28 are in an open state or an extended state relative to the first rail 22.

Figures 16, 17:
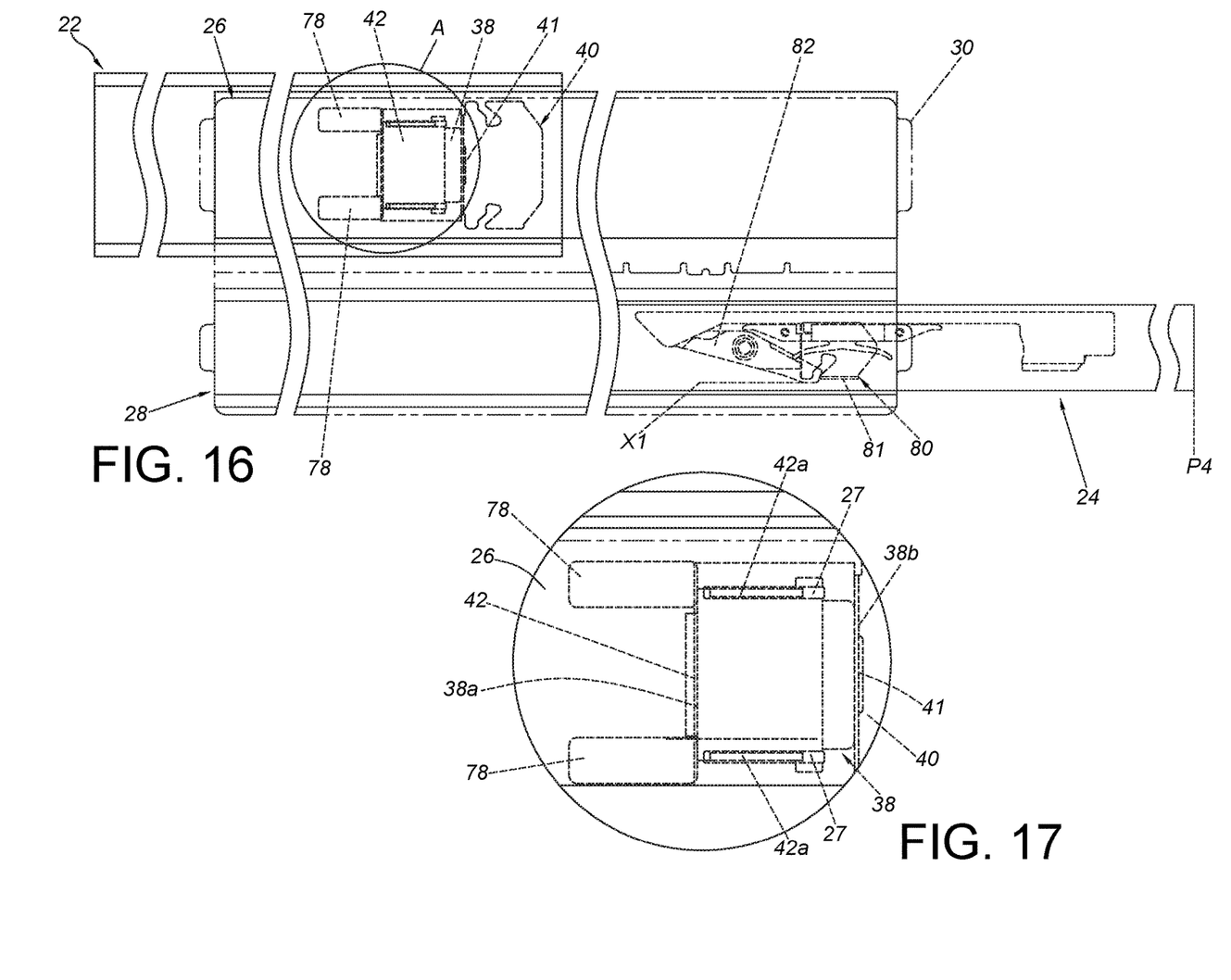
FIG. 16 is a diagram showing the mounting member further contacting the buffer member through the contact member when the second rail is moved to an open position along the first direction according to an embodiment of the present invention.
FIG. 17 is an enlarged view of an area A of FIG. 16.

As shown in. FIG. 14 to FIG. 17, when the mounting member 30 is in the open state, the second rail 24 can be moved relative to the fourth rail 28 along the first direction D1 to an open position P4, and the blocking member 82 can contact a blocking part 81 of the second blocking base 80 at a blocking position X1, in order to prevent the second rail 24 from being further moved along the first direction D1. Wherein, if the second rail 24 is pulled out to move at high speed along the first direction D1, an impact force between the blocking member 82 and the blocking part 81 of the second blocking base 80 is strong accordingly. Therefore, the contact member 78 is configured to contact the buffer member 38 to provide a buffer effect and reduce impact noise. In the present embodiment, the contact member 78 is configured to contact a first end part 38a of the buffer member 38 through the holding base 42, and a second end part 38b of the buffer member 38 is configured to abut against the blocking wall 41 of the first blocking base 40 (as shown in FIG. 17) for providing a buffer effect, such that the mounting member 30 or related components of the slide rail can be protected. Preferably, the holding base 42 is movably mounted to the first rail 22. For example, the holding base 42 has two supporting legs 42a respectively extending into elongated grooves 27 (or elongated holes) of the first rail 22. Therefore, the holding base 42 can be slightly driven by the contact member 78 to push the buffer member 38, such that the buffer member 38 can abut against the blocking wall 41 of the first blocking base 40 to provide the buffer effect. However, in an alternative embodiment, the contact member 78 can directly push the buffer member 38. Such arrangement can also provide the buffer effect and protect related components of the slide rail.

Figure 18:
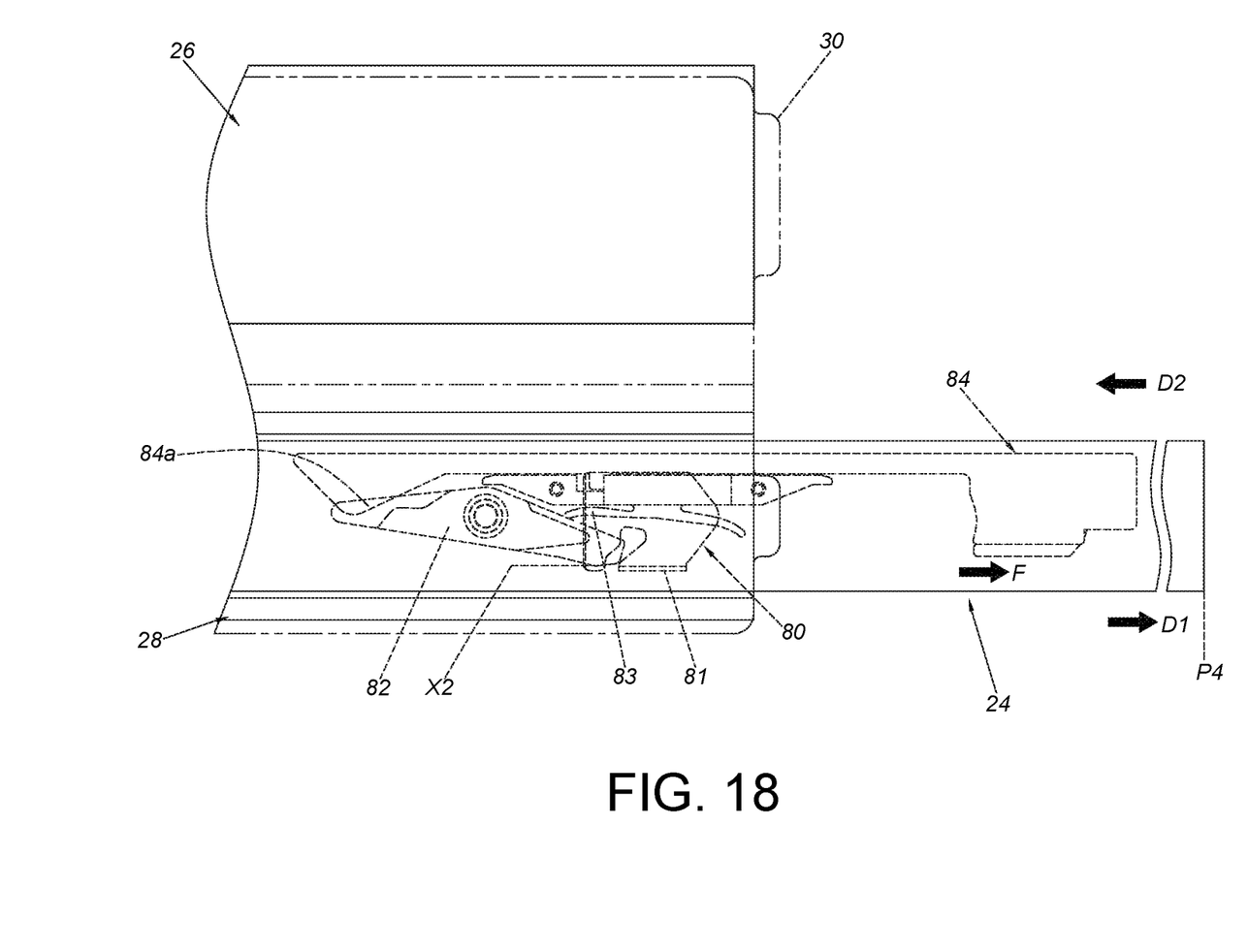
FIG. 18 is a diagram showing the second rail being located at the open position according to an embodiment or the present invention.

As shown in FIG. 18, when the mounting member 30, the third rail 26 and the fourth rail 28 are in the open state, the second rail 24 can be moved relative to the fourth rail 28 along the first direction D1 to the open position P4. In addition, when a user applies a force F to the operating member 84, a disengaging part 84a of the operating member 84 further moves the blocking member 82 to be no longer located at the blocking position X1 (for example, the blocking member 82 is located at an unblocking position X2), such that the blocking member 82 no longer contacts the blocking part 81 of the second blocking base 80 to allow the second rail 24 to be further moved along the first direction D1 and detached from the fourth rail 28. Or, when the second rail 24 it located at the open position P4, the user can retract the second rail 24 from the open position P4 along the second direction D2.

Figure 19:
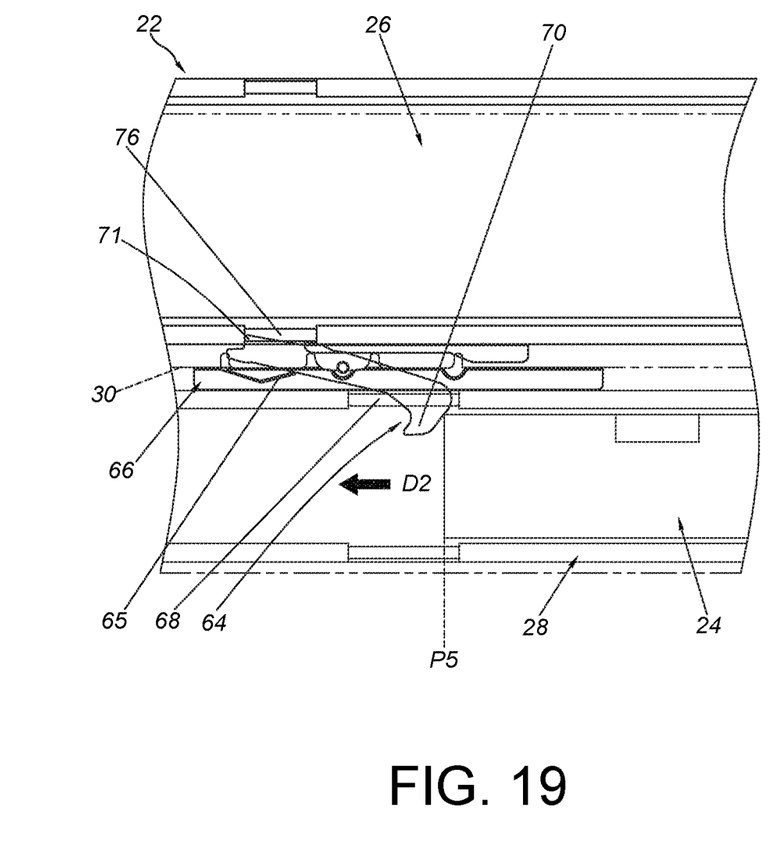
FIG. 19 is a diagram showing the second rail contacting the engaging member during a process of the second rail of the slide rail assembly being moved from the open position along a second direction according to an embodiment or the present invention.
Figure 20:
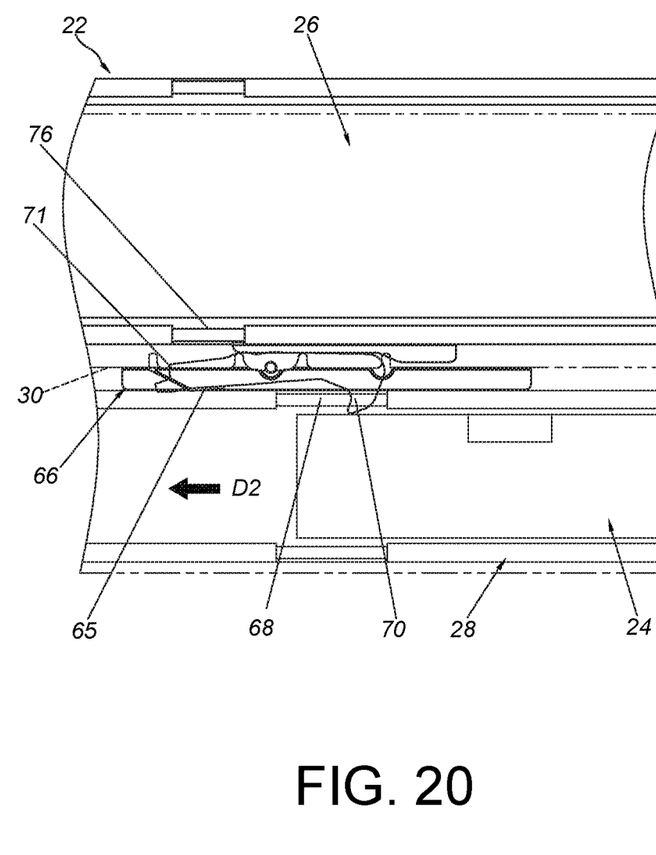
FIG. 20 is a diagram showing the engaging member being driven by the second rail to be disengaged from the positioning part of first rail during a process of the second rail of the slide rail assembly being further moved along the second direction according to an embodiment of the present invention.

As shown in FIG. 19 and FIG. 20, when the second rail 24 is moved from the open position P4 to a predetermined retracted position P5 along the second direction D2, the second rail 24 is configured to drive the engaging member 64 to deflect. As such, the elastic member 66 (or the elastic part. 65 of the elastic member 66) accumulates an elastic force, and the second engaging part 71 of the engaging member 64 is no longer engaged with the positioning part 76 of the first rail 22. In other words, the mounting member 30 is movable relative to the first rail 22 along the second direction D2, such that the second rail 24, the mounting member 30, the third rail 26 and the fourth rail 28 can be retracted relative to the first rail 22 along the second direction D2.

Therefore, the slide rail assembly of the present invention is characterized in that:

1. The third rail 26 is movable relative to the first rail 22, and the second rail 24 is movable relative to the fourth rail 28; wherein the first rail 22 and the second rail 24 are up-down arranged and parallel to each other, such that the first rail 22 and the second rail 24 are arranged at different heights. Such arrangement is different from the slide rail assembly of the prior art having two or more than two slide rails arranged at a same height. The third rail 26 and the fourth rail 28 of the present invention are connected to two different parts (such as the upper part and the lower part) of the mounting member 30, in order to work with the first rail 22 and the second rail 24 to meet width limitation. As such, the slide rail assembly 20 can comprise more than two slide rails and have a smaller width.

2. The third rail 26 and the fourth rail 28 are connected to two different parts of the mounting member 30 in order to work with the first rail 22 and the second rail 24. As such, the structural strength or supporting strength of the slide rail assembly 20 can be improved.

3. When the second rail 24 is moved to a predetermined position along the first direction D1, the mounting member 30, the third rail 26 and the fourth rail 28 can be synchronously moved with the second rail 24 through the engaging member 64.

4. When the second rail 24 is moved to an open position (such as a completely open position), the contact member 78 is configured to contact the buffer member 38 in order to prevent the blocking member 82 at the blocking position X1 from directly contacting or colliding with the blocking part 81 of the second blocking base 80.

5. In addition to allowing the mounting member 30 to be synchronously moved with the second rail 24, the engaging member 64 is also configured to engage with the first rail 22, in order to prevent the mounting member 30 from being moved relative to the first rail 22 along the first direction D1 or the second direction D2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
   a first rail comprising a first wall, a second wall and a side wall connected between the first wall and the second wall of the first rail, a first passage is defined by the first wall, the second wall and the side wall;
   a second rail comprising a first wall, a second wall and a side wall connected between the first wall and the second wall of the second rail;
   a mounting member comprising a first part and a second part;
   a third rail fixedly connected to a first side of the mounting member and movable relative to the first rail through the first passage, wherein the third rail comprises a first wall, a second wall and a side wall connected between the first wall and the second wall of the third rail, the side wall of the third rail is connected to the first part of the mounting member, and the first wall and the second wall of the third rail are located within the first passage;
   a fourth rail fixedly connected to a second side of the mounting member, wherein the fourth rail comprises a first wall, a second wall and a side wall connected between the first wall and the second wall of the fourth rail, the side wall of the fourth rail is connected to the second part of the mounting member, a second passage is defined by the first wall, the second wall and the side wall of the fourth rail, the second rail is movable relative to the fourth rail through the second passage, and the first wall and the second wall of the second rail are located within the second passage;
   a first slide assisting device movably mounted between the first rail and the third rail, wherein the first slide assisting device comprises a plurality of slide assisting members configured to be supported between the first wall of the first rail and the first wall of the third rail, and configured to be supported between the second wall of the first rail and the second wall of the third rail;
   a second slide assisting device movably mounted between the fourth rail and the second rail, wherein the second slide assisting device comprises a plurality of slide assisting members configured to be supported between the first wall of the second rail and the first wall of the fourth rail, and configured to be supported between the second wall of the second rail and the second wall of the fourth rail; and
   an engaging member and an elastic member, wherein the engaging member is movably mounted to the mounting member, the elastic member is configured to provide an elastic force to the engaging member; wherein when the second rail is moved from a retracted position to a first predetermined position along a first direction, the engaging member is engaged with the second rail in response to the elastic force of the elastic member, so as to allow the mounting member to be synchronously moved with the second rail along the first direction;
   wherein the third rail is movable relative to the first rail, and the second rail is movable relative to the fourth rail;
   wherein the mounting member further comprises a horizontal part, and the first part and the second part are substantially perpendicularly connected to the horizontal part and respectively extended along different directions;
   wherein the engaging member is pivoted to the mounting member, one of the first wall and the second wall of the fourth rail has a notch, the notch is configured to allow an engaging part of the engaging member to insert therein, and one of the first wall and the second wall of the second rail has an abutting part; wherein when the second rail is located at the first predetermined position, the engaging part of the engaging member contacts the abutting part, in order to allow the second rail to drive the mounting member to move along the first direction through the abutting part.

2. The slide rail assembly of claim 1, wherein the first rail and the second rail are up-down arranged and parallel to each other.

3. The slide rail assembly of claim 1, wherein the first side of the mounting member is opposite to the second side of the mounting member.

4. The slide rail assembly of claim 1, wherein the first wall of the first rail has a first section and a second section bent relative to the first section, and the second wall of the first rail has a third section and a fourth section bent relative to the third section.

5. The slide rail assembly of claim 1, further comprising a working member arranged on the first rail, wherein when the second rail is moved from the first predetermined position to a second predetermined position along the first direction, the engaging member is moved by the working member to disengage the engaging part of the engaging member from the abutting part, such that the mounting member is no longer synchronously moved with the second rail.

6. The slide rail assembly of claim 5, wherein one of the first wall and the second wall of the first rail has a positioning part; when the mounting member is moved to a third predetermined position along the first direction, the engaging member is engaged with the positioning part of the first rail in response to the elastic force of the elastic member, in order to prevent the mounting member from being moved relative to the first rail along the first direction or a second direction.

7. The slide rail assembly of claim 6, wherein a second blocking base is arranged adjacent to a front part of the fourth rail, and a blocking member is movably connected to the second rail; when the second rail is moved relative to the fourth rail along the first direction to an open position, the blocking member is configured to contact a blocking part of the second blocking base at a blocking position, in order to prevent the second rail from being further moved along the first direction, and an operating member is configured to be operated to move the blocking member to be no longer at the blocking position.

8. The slide rail assembly of claim 7, wherein when the second rail is moved from the open position to a predetermined retracted position along the second direction, the second rail is configured to drive the engaging member to move, to disengage the engaging member from the positioning part of the first rail.

9. The slide rail assembly of claim 5, further comprising a buffer member arranged on the first rail, and a contact member arranged on the third rail, wherein when the mounting member is moved a predetermined distance along the first direction, the contact member contacts the buffer member for providing a buffer effect.

10. The slide rail assembly of claim 9, wherein a first blocking base is arranged adjacent to a front part of the first rail, the slide rail assembly further comprises a holding base, and the buffer member is mounted between the first blocking base and the holding base.

* * * * *